(12) United States Patent
Pandey et al.

(10) Patent No.: US 11,393,915 B2
(45) Date of Patent: Jul. 19, 2022

(54) EPI SEMICONDUCTOR STRUCTURES WITH INCREASED EPI VOLUME IN SOURCE/DRAIN REGIONS OF A TRANSISTOR DEVICE FORMED ON AN SOI SUBSTRATE

(71) Applicant: GLOBALFOUNDRIES U.S. Inc., Santa Clara, CA (US)

(72) Inventors: Shesh Mani Pandey, Saratoga Springs, NY (US); Judson Robert Holt, Ballston Lake, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/116,167

(22) Filed: Dec. 9, 2020

(65) Prior Publication Data

US 2022/0181468 A1 Jun. 9, 2022

(51) Int. Cl.
| | |
|---|---|
| *H01L 27/12* | (2006.01) |
| *H01L 21/336* | (2006.01) |
| *H01L 29/786* | (2006.01) |
| *H01L 29/66* | (2006.01) |

(Continued)

(52) U.S. Cl.
CPC .... *H01L 29/66636* (2013.01); *H01L 27/1207* (2013.01); *H01L 29/6656* (2013.01); *H01L 29/7848* (2013.01)

(58) Field of Classification Search
CPC ........... H01L 21/28141; H01L 27/1203; H01L 27/1207; H01L 29/0653; H01L 29/6653; H01L 29/66553; H01L 29/6656; H01L 29/66636; H01L 29/7848; H01L 27/165; H01L 27/66772

See application file for complete search history.

(56) References Cited

U.S. PATENT DOCUMENTS

| | | |
|---|---|---|
| 5,461,250 A | 10/1995 | Burghartz et al. |
| 7,268,024 B2 | 9/2007 | Yeo et al. |
| 8,395,217 B1 | 3/2013 | Cheng et al. |

(Continued)

OTHER PUBLICATIONS

Notice of Allowance and Fee(s) Due dated Mar. 24, 2021 for U.S. Appl. No. 16/727,453, filed Dec. 26, 2019; pp. 9.

(Continued)

*Primary Examiner* — David C Spalla
(74) *Attorney, Agent, or Firm* — Hoffman Warnick LLC

(57) ABSTRACT

A transistor device formed on a semiconductor-on-insulator (SOI) substrate including a bulk semiconductor layer, a buried insulation (BOX) layer positioned on the bulk semiconductor layer, and an active semiconductor layer positioned on the BOX layer. The transistor device includes: a gate structure, a sidewall spacer, and a source/drain region; a plurality of distinct openings extending through the active semiconductor layer of the SOI substrate in the source/drain region adjacent the sidewall spacer, each opening of the plurality of openings extending to a respective recess formed in the BOX layer of the SOI substrate in the source/drain region adjacent the sidewall space, wherein each recess extends under a portion of the active semiconductor layer; and an epitaxial (epi) semiconductor material disposed in the recesses in the BOX layer, in the plurality of openings through the active semiconductor layer, and over a surface of the active semiconductor layer.

20 Claims, 12 Drawing Sheets

(51) Int. Cl.
*H01L 29/78* (2006.01)
*H01L 29/06* (2006.01)

(56) References Cited

U.S. PATENT DOCUMENTS

| | | | |
|---|---|---|---|
| 9,337,350 B2* | 5/2016 | Posseme | H01L 29/66636 |
| 9,536,945 B1* | 1/2017 | de Souza | H01L 29/78 |
| 9,646,993 B2* | 5/2017 | Cheng | H01L 27/0207 |
| 2010/0258868 A1 | 10/2010 | Yin et al. | |
| 2011/0024840 A1* | 2/2011 | Khater | H01L 29/66628 |
| | | | 257/E21.409 |
| 2011/0241084 A1 | 10/2011 | Wu et al. | |
| 2012/0292700 A1 | 11/2012 | Khakifirooz et al. | |
| 2013/0161746 A1* | 6/2013 | Posseme | H01L 29/66772 |
| | | | 438/151 |
| 2014/0141589 A1 | 5/2014 | Shin et al. | |
| 2014/0346600 A1* | 11/2014 | Cheng | H01L 29/66636 |
| | | | 257/347 |
| 2014/0370668 A1 | 12/2014 | Niebojewski et al. | |
| 2017/0236936 A1* | 8/2017 | Then | H01L 21/823431 |
| | | | 257/76 |
| 2020/0135895 A1 | 4/2020 | Pandey et al. | |

OTHER PUBLICATIONS

Office Action dated Jan. 7, 2021 for U.S. Appl. No. 16/727,453, filed Jan. 26, 2019; pp. 13.

* cited by examiner

EPI SEMICONDUCTOR STRUCTURES WITH INCREASED EPI VOLUME IN SOURCE/DRAIN REGIONS OF A TRANSISTOR DEVICE FORMED ON AN SOI SUBSTRATE

BACKGROUND

The present disclosure generally relates to the fabrication of integrated circuits, and more particularly, to various epitaxial (epi) semiconductor material structures with increased epi volume in the source/drain regions of a transistor device formed on a semiconductor-on-insulator (SOI) substrate.

In modern integrated circuits, such as microprocessors, storage devices, and the like, a very large number of circuit elements, especially transistors, may be provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. Complementary metal oxide semiconductor (CMOS) technology or products refers to integrated circuit products that are manufactured using both NMOS and PMOS transistor devices. Irrespective of the physical configuration of the transistor device, each transistor device generally comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the source region and the drain region and current flows from the source region to the drain region.

Fully depleted transistor devices are typically formed on a relative thin active layer of an SOI substrate. The SOI substrate includes a bulk semiconductor layer, a buried insulation layer positioned on the bulk semiconductor layer, and an active semiconductor layer positioned on the buried insulation layer. In many situations, an epitaxial semiconductor material is grown on the active semiconductor layer in the source/drain regions of the transistor device by performing an epitaxial growth process. For example, the epi semiconductor material may be formed in such a manner that it imparts a desired stress on the channel region of the transistor, i.e., a compressive stress for a PFET device or a tensile stress for an NFET device.

In some applications, the exposed portions of the active semiconductor layer in the source/drain regions may be slightly etched to form a recess in the active semiconductor layer prior to forming the epi semiconductor material. However, this recess in the active semiconductor layer does not typically expose the underlying buried insulation layer. The recess is formed in the active semiconductor layer prior to forming the epi semiconductor material so that more of the epi semiconductor material may be positioned adjacent the channel region of the transistor. However, in some situations, due to processing operations performed after the formation of the epi semiconductor material, the epi semiconductor material may relax, thereby reducing the amount of desirable stress imparted to the channel region of the transistor and reducing the performance characteristics of the transistor.

SUMMARY

Generally, the present disclosure is directed to epi semiconductor material structures in the source/drain regions of a transistor device formed on a semiconductor-on-insulator (SOI) substrate. One illustrative device disclosed herein according to embodiments includes a transistor device formed on a semiconductor-on-insulator (SOI) substrate that includes a bulk semiconductor layer, a buried insulation (BOX) layer positioned on the bulk semiconductor layer, and an active semiconductor layer positioned on the BOX layer, wherein the transistor device includes: a gate structure, a sidewall spacer, and a source/drain region; a plurality of distinct openings extending through the active semiconductor layer of the SOI substrate in the source/drain region adjacent the sidewall spacer, each opening of the plurality of openings extending to a respective recess formed in the BOX layer of the SOI substrate in the source/drain region adjacent the sidewall space, wherein each recess extends under a portion of the active semiconductor layer; and an epitaxial (epi) semiconductor material disposed in the recesses in the BOX layer, in the plurality of openings through the active semiconductor layer, and over a surface of the active semiconductor layer.

Another illustrative device disclosed herein according to embodiments includes an integrated circuit device, including: a transistor device formed on a semiconductor-on-insulator (SOI) substrate that includes a bulk semiconductor layer, a buried insulation (BOX) layer positioned on the bulk semiconductor layer, and an active semiconductor layer positioned on the BOX layer, the transistor device including: a gate structure, a sidewall spacer, and a source/drain region; a plurality of distinct openings extending through the active semiconductor layer of the SOI substrate in the source/drain region adjacent the sidewall spacer, each opening of the plurality of openings separated from each other by a portion of the active semiconductor layer, each opening of the plurality of openings extending to a respective recess formed in the BOX layer of the SOI substrate in the source/drain region adjacent the sidewall space, wherein each recess extends under a portion of the active semiconductor layer; an epitaxial (epi) semiconductor material disposed in the recesses the BOX layer, in the plurality of openings through the active semiconductor layer, and over a surface of the active semiconductor layer; and a conductive source/drain contact structure on the epi semiconductor material in the source/drain region of the transistor device.

An illustrative method according to embodiments includes: providing a semiconductor-on-insulator (SOI) substrate comprising a bulk semiconductor layer, a buried insulation (BOX) layer positioned on the bulk semiconductor layer, and an active semiconductor layer positioned on the BOX layer; forming a transistor device on the SOI substrate, the transistor device including a gate structure, a sidewall spacer, and a source/drain region; forming a plurality of distinct openings through the active semiconductor layer of the SOI substrate in a source/drain region of the transistor device adjacent the sidewall spacer; forming a recess in the BOX layer of the SOI substrate under each opening of the plurality of openings, wherein each recess extends under a portion of the active semiconductor layer; and forming an epitaxial (epi) semiconductor material in each recess in the BOX layer, in the plurality of openings through the active semiconductor layer, and over a surface of the active semiconductor layer.

BRIEF DESCRIPTION OF THE DRAWINGS

The disclosure may be understood by reference to the following description taken in conjunction with the accompanying drawings, in which like reference numerals identify like elements.

Figure 1:
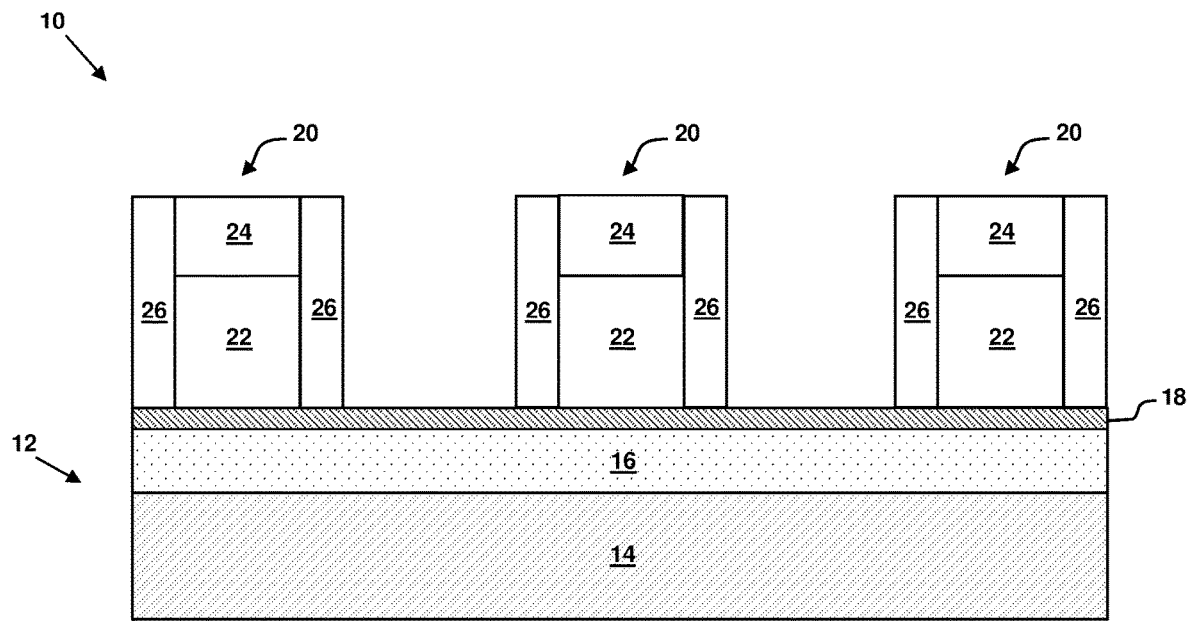
FIG. 1 depicts an IC product after gates for transistor devices have been formed above an SOI substrate according to embodiments of the disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of a term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods disclosed herein for forming a large volume of epi semiconductor material in the source/drain regions of a transistor device that is formed on a semiconductor-on-insulator substrate and associated device structures. As will be readily apparent to those skilled in the art upon a complete reading of the present application, the present method may be applicable to a variety of products, including, but not limited to, logic products, memory products, etc. For example, the method disclosed herein may be employed on any type of application in any type of integrated circuit product, circuit, or device where epi semiconductor material is formed in the source/drain regions of a transistor device. In the embodiments depicted herein, the transistor devices are planar transistor devices. However, after a complete reading of the present application, those skilled in the art will appreciate that the methods disclosed herein may be employed with other types of transistor devices, such as FinFET devices. Thus, the presently disclosed embodiments should not be considered to be limited to any particular type of integrated circuit product or any particular form of transistor devices. Additionally, various doped regions, e.g., halo implant regions, doped source/drain regions, well regions and the like, and certain material layers, e.g., etch stop contact layers, may not be depicted in the attached drawings. With reference to the attached figures, various illustrative embodiments of the methods and devices disclosed herein will now be described in more detail.

As depicted in the figures, an illustrative integrated circuit (IC) product 10 disclosed herein will be formed in and above a semiconductor-on-insulator (SOI) substrate 12. The SOI substrate 12 includes a bulk semiconductor layer 14, a buried insulation (BOX) layer 16, and an active semiconductor layer 18. A plurality of transistor devices 20 may be formed in and above the active semiconductor layer 18. The active semiconductor layer 18 and/or the bulk semiconductor layer 14 may be formed of silicon or they may be made of semiconductor materials other than silicon, and they both do not have to be made of the same semiconductor material. Thus, the terms "substrate" or "semiconductor substrate" should be understood to cover all suitable semiconducting materials and all forms of such materials. The BOX layer 16 may be formed from a variety of different insulating materials, e.g., silicon dioxide.

The transistor devices 20 may be NFET devices, PFET devices, or a combination of NFET and PFET devices. In one illustrative embodiment, the transistor devices 20 may all be PFET devices. In the example depicted herein, an epi semiconductor material will be formed in the source/drain regions of the transistor devices 20.

The various components and structures of the devices disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 1 depicts the IC product 10 after gates for the transistor devices 20 have been formed above the SOI substrate 12. The gates of the transistor devices 20 generally comprise a gate structure 22, a gate cap 24, and sidewall spacers 26. The gate structures 22 typically include a gate insulation layer (not separately shown) and one or more conductive material layers (not separately shown) that function as the conductive gate electrode for the transistor devices 20. The gate structures 22 may be manufactured using well-known techniques, such as gate-first or replacement gate manufacturing techniques. The gate insulation layer of the gate structures 22 may be comprised of a variety of different materials, e.g., silicon dioxide, a high-k (k value greater than 10) layer of insulating material, such as, for example, hafnium oxide, etc. The gate electrode of the gate structures 22 of the transistor devices 20 may be comprised of a variety of materials, e.g., amorphous silicon, polysilicon, one or more layers of metal, etc.

With continuing reference to FIG. 1, the sidewall spacers 26 for the transistor devices 20 may be formed by performing the following process operations. First, a conformal layer of spacer material (not shown), e.g., silicon nitride, SiNC, SiN, SiCO and SiNOC, may be formed on the IC product 10 by performing a conformal deposition process, e.g., a conformal ALD deposition process. Next, an anisotropic etching process may be performed to remove horizontally positioned portions of the layer of spacer material so as to form the depicted sidewall spacers 26 on the transistor devices 20.

Figure 2:
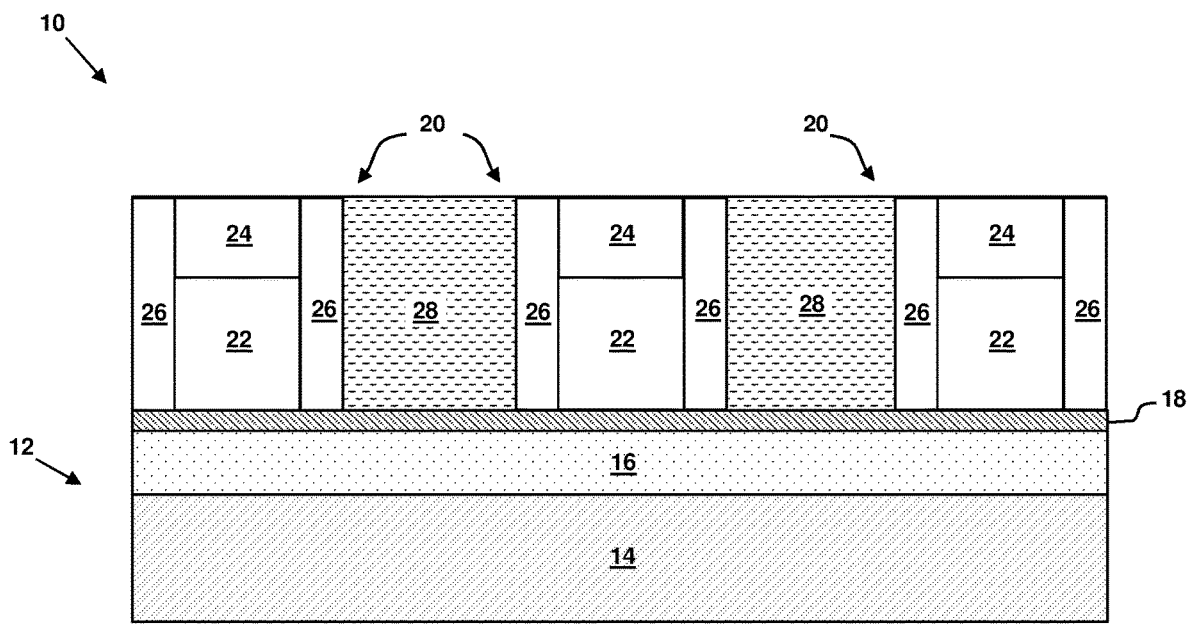
FIG. 2 depicts the IC product of FIG. 1 after a conformal layer of sacrificial spacer material has been formed over the transistor devices and selectively etched such a layer of sacrificial spacer material remains atop the active semiconductor layer between the transistor devices according to embodiments of the disclosure.

FIG. 2 depicts the IC product 10 of FIG. 1 after a conformal layer of a sacrificial spacer material 28 has been formed over the transistor devices 20 and selectively etched, such the layer of sacrificial spacer material 28 only remains atop the active semiconductor layer 18 between the transistor devices 20. The layer of sacrificial spacer material 28 may be composed of a material (e.g., silicon dioxide) that may be selectively etched relative to the material of the sidewall spacers 26 and may be formed to any desired thickness.

Figure 3:
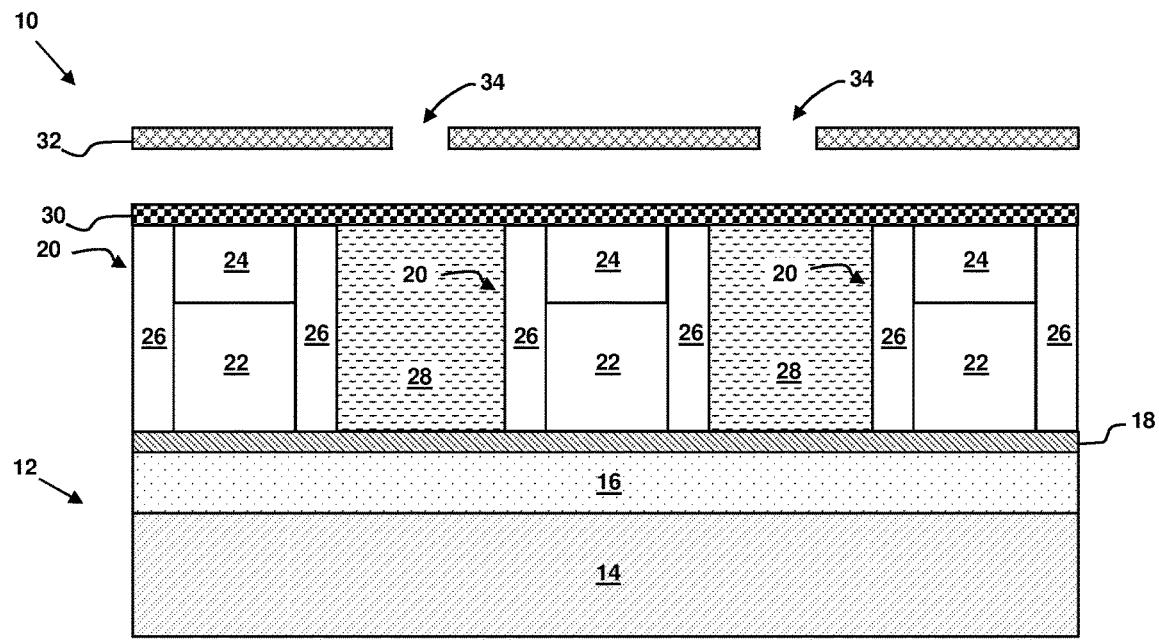
FIG. 3 depicts the IC product of FIG. 2 after a layer of a photoresist has been applied over the layer of sacrificial spacer material according to embodiments of the disclosure.

A chemically-amplified (CA) photoresist masking process (or other suitable masking process) may be subsequently performed to selectively form a set of openings through the layer of sacrificial spacer material 28 and the active semiconductor layer 18 to the surface of the BOX layer 16. FIG. 3, for example, depicts the IC product 10 of FIG. 2 after a layer of a photoresist 30 has been applied over the transistor devices 20 and the layer of sacrificial spacer material 28. After application of the layer of photoresist 30, the photoresist 30 is exposed using a mask 32 containing a plurality of distinct openings 34 and developed in a known manner.

Figure 4:
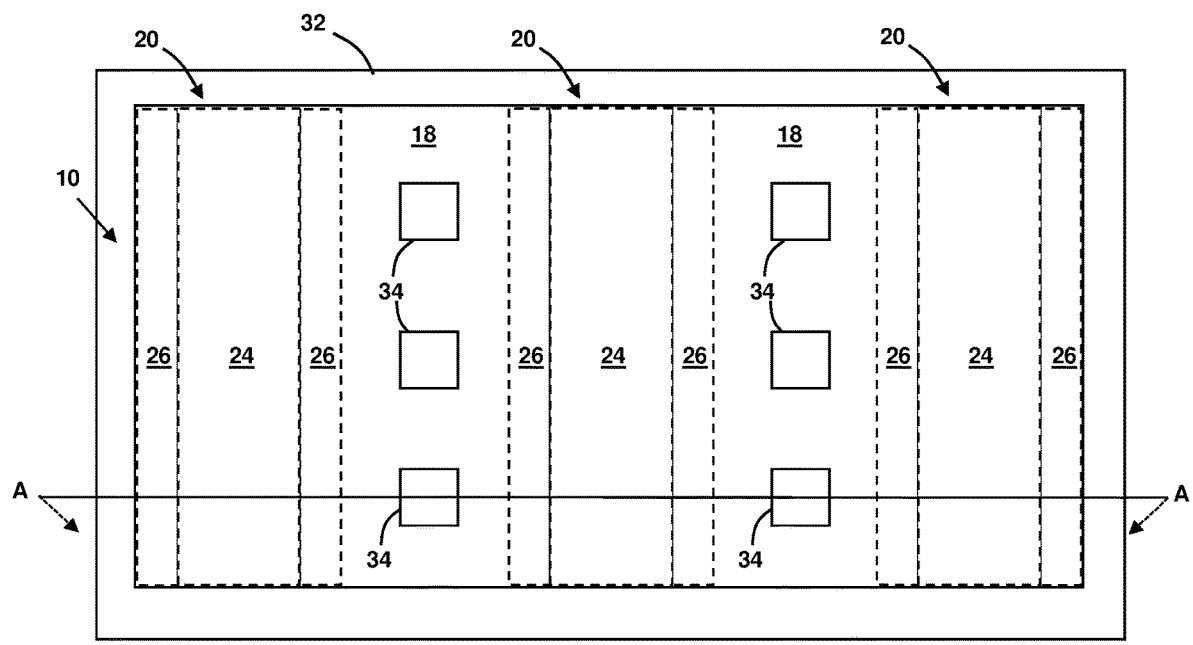
FIG. 4 depicts a plan view of a mask, superimposed over the IC product according to embodiments of the disclosure.

A plan view of the mask 32, superimposed over the IC product 10 with the layer of sacrificial spacer material 28 and the layer of photoresist 30 removed for clarity, is depicted in FIG. 4. As shown, the openings 34 in the mask 32 may be positioned between the transistor devices 20 (e.g., over the source/drain regions of the transistor devices 20). Although illustrated as having a square configuration in FIG. 4, the openings 34 in the mask 32 may have other configurations (e.g., rectangular, polygonal, circular, ovoid, tapered, etc.). Further, as will be appreciated upon a complete understanding of the present disclosure, the number, configuration, size, separation, alignment, and positioning of the openings 34 in the mask 32 may vary (e.g., may be optimized) depending on process requirements, device requirements (e.g. stress requirements), and/or other factors.

Figure 5:
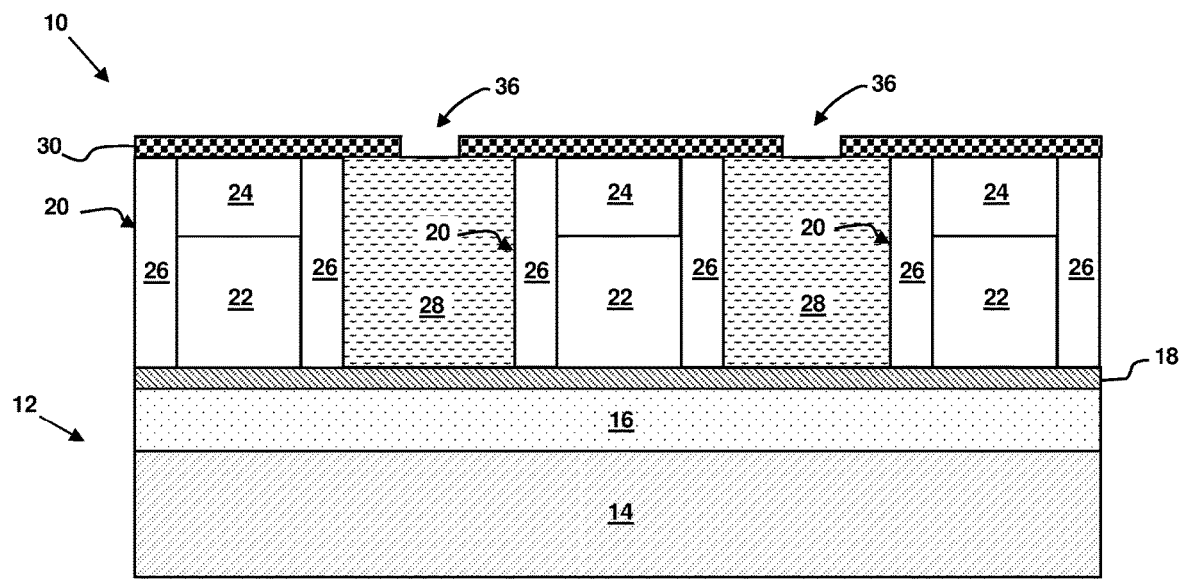
FIG. 5 is a cross-sectional view of a portion of the IC product taken along line A-A of FIG. 4 after the development of the layer of photoresist according to embodiments of the disclosure.

A cross-sectional view of a portion of the IC product 10 taken along line A-A of FIG. 4 after the development of the layer of photoresist 30 is depicted in FIG. 5. As shown, a plurality of distinct openings 36 corresponding to the openings 34 in the mask 32 have been formed in the hardened photoresist 30. The openings 36 are positioned between the transistor devices 20 (e.g., over the source/drain regions of the transistor devices 20) and over the sacrificial spacer material 28.

Figure 6:
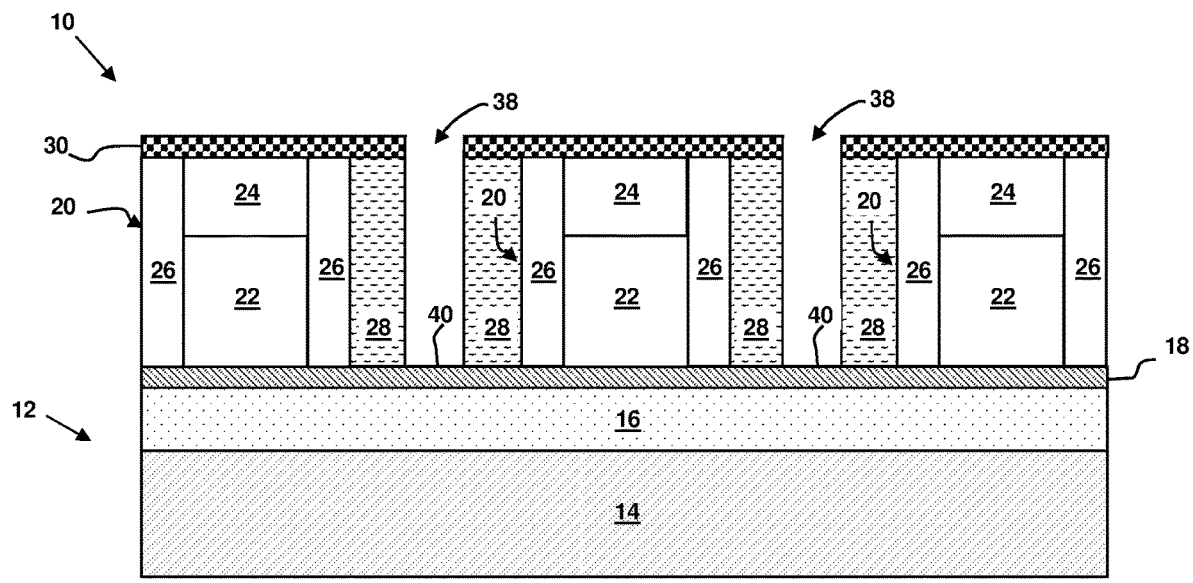
FIG. 6 depicts the IC product of FIG. 5 after an anisotropic etching process has been performed to form an opening in the layer of sacrificial spacer material below each opening in the hardened photoresist according to embodiments of the disclosure.

FIG. 6 depicts the IC product 10 of FIG. 5 after an anisotropic etching process has been performed via the openings 36 in the hardened photoresist 30 to selectively form a plurality of distinct openings 38 in the underlying layer of sacrificial spacer material 28. As shown in FIG. 6, the anisotropic etching process stops on and exposes portions of an upper surface 40 of the active semiconductor layer 18 located between the transistor devices 20. The portions of the layer of sacrificial spacer material 28 not located under the openings 36 in the hardened photoresist 30 are not etched during this anisotropic etching process.

Figure 7:
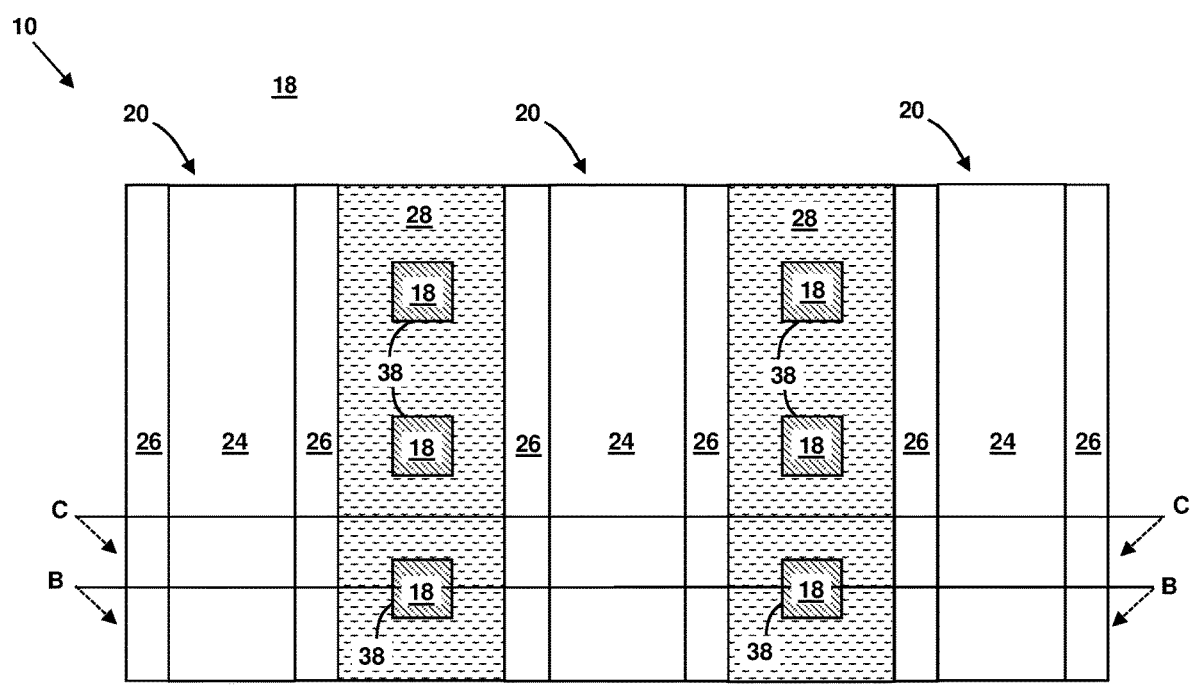
FIG. 7 is a plan view of the IC product of FIG. 6 after a subsequent removal of the hardened photoresist according to embodiments of the disclosure.
Figure 8:
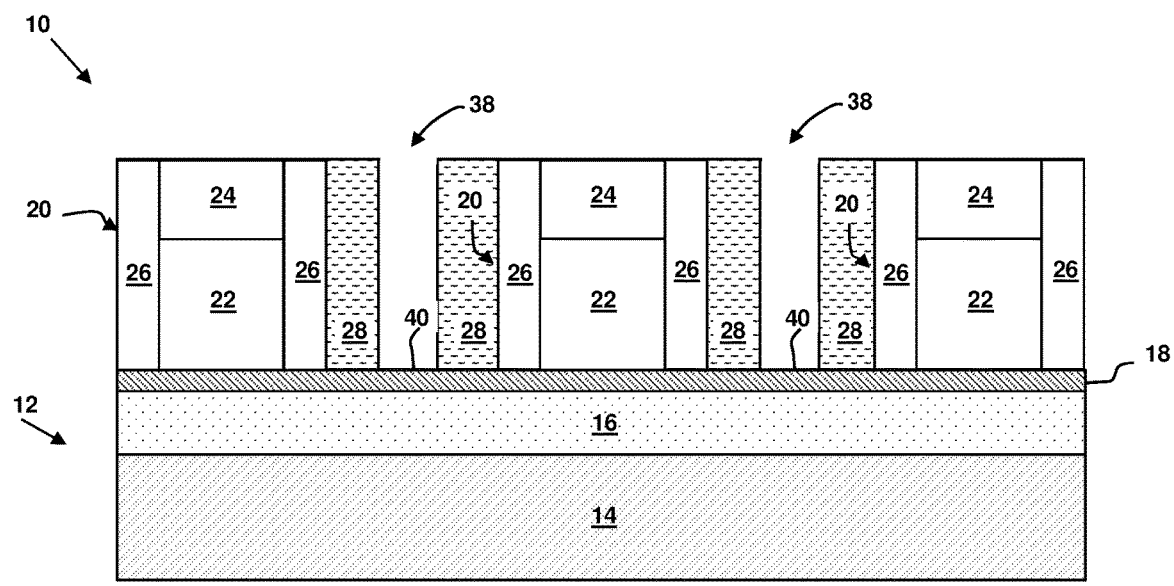
FIG. 8 is a cross-sectional view of a portion of the IC product taken along line B-B in FIG. 7 according to embodiments of the disclosure.
Figure 9:
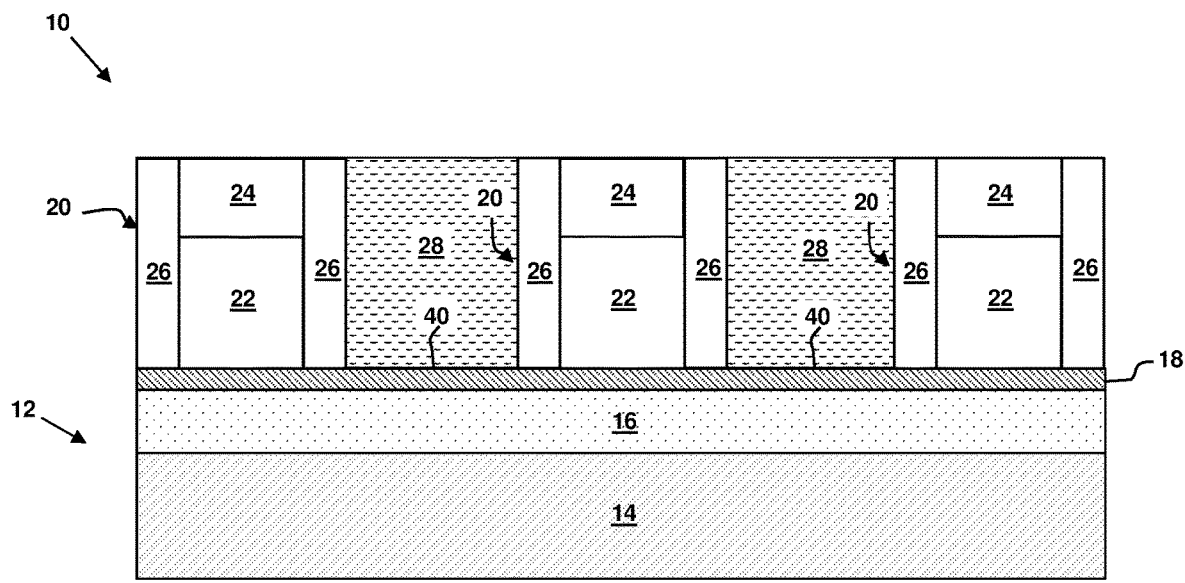
FIG. 9 is a cross-sectional view of a portion of the IC product taken along line C-C in FIG. 7 according to embodiments of the disclosure.

A plan view of the IC product 10 of FIG. 6 after a subsequent removal of the hardened photoresist 30 is depicted in FIG. 7. FIG. 8 is a cross-sectional view of a portion of the IC product 10 of FIG. 7 taken along line B-B in FIG. 7. FIG. 9 is a cross-sectional view of a portion of the IC product 10 of FIG. 7 taken along line C-C in FIG. 7.

Figure 10:
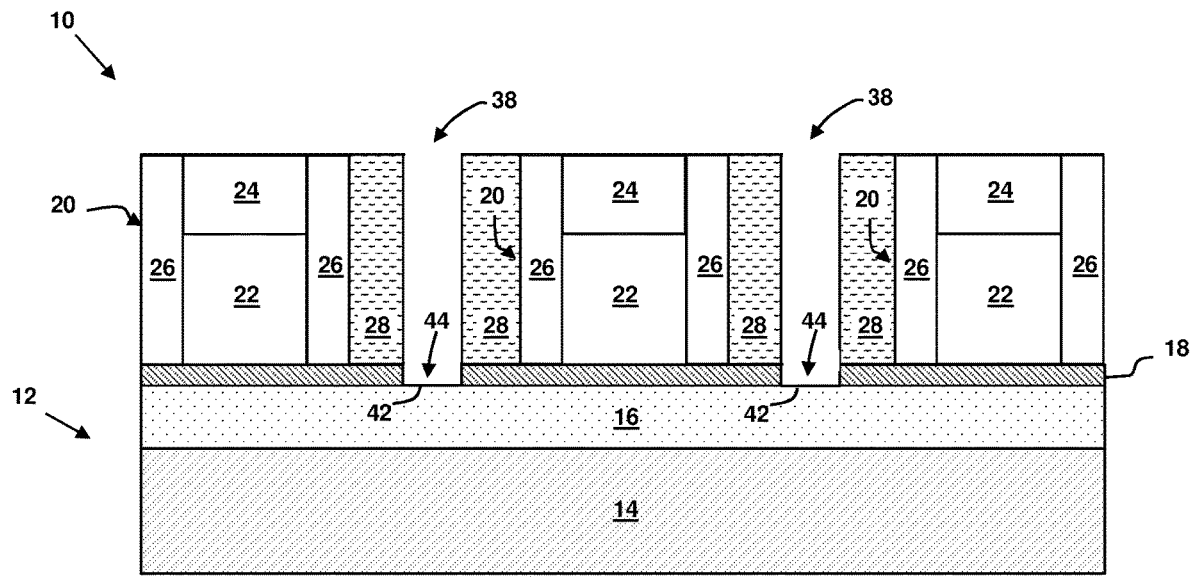
FIG. 10 depicts the portion of the IC product of FIG. 8 after another anisotropic etching process has been performed to remove the exposed portions of the active semiconductor layer within the openings according to embodiments of the disclosure.

FIG. 10 depicts the portion of the IC product 10 shown in FIG. 8 after another anisotropic etching process has been performed to remove the portions of the active semiconductor layer 18 that have been exposed via the openings 38 in the layer of sacrificial spacer material 28. The anisotropic etching process removes the active semiconductor layer 18 at the bottom of the openings 38 and stops on and exposes portions of an upper surface 42 of the underlying BOX layer 16. As a result of this anisotropic etching process, a plurality of openings 44 have been selectively formed in the active semiconductor layer 18 at the bottom of the openings 38 in the layer of sacrificial spacer material 28.

Figure 11:
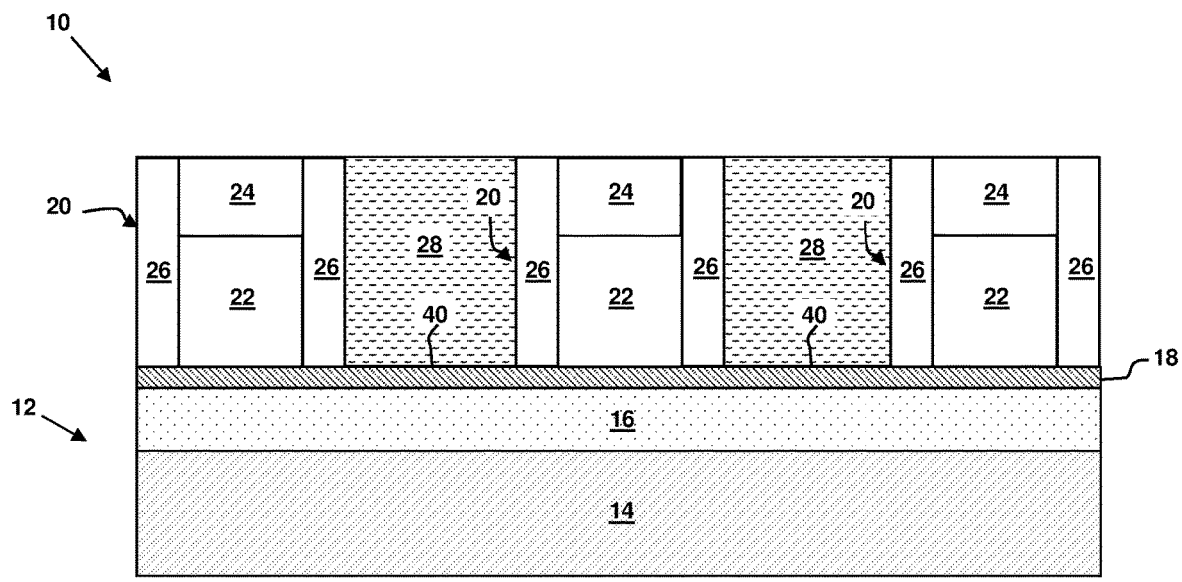
FIG. 11 depicts the portion of the IC product of FIG. 9 after the anisotropic etching process according to embodiments of the disclosure.

FIG. 11 depicts the portion of the IC product 10 of FIG. 9 after this anisotropic etching process. As shown in FIG. 11, the portions of the active semiconductor layer 18 not exposed via the openings 38 have not been affected by this anisotropic etching process. To this extent, a substantial portion of the active semiconductor layer 18 remains in situ between/adjacent the transistor devices 20.

Figure 12:
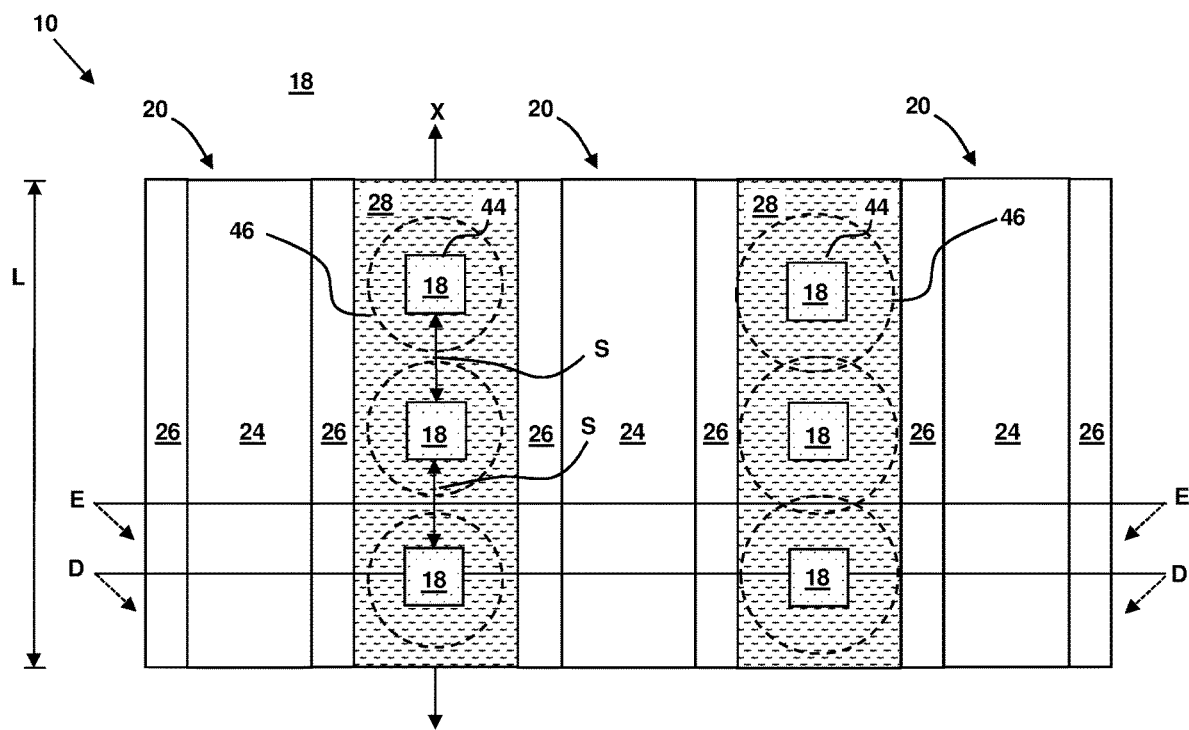
FIG. 12 is a plan view of the IC product after an isotropic etching process has been performed on the buried insulation layer through the openings formed in the active semiconductor layer according to embodiments of the disclosure.

FIG. 12 is a plan view of the IC product 10 after a subsequent isotropic etching process has been performed on the exposed BOX layer 16 via the openings 44 formed in the active semiconductor layer 18. The isotropic etching process results in the formation of a plurality of recesses 46 in the BOX layer 16. The recesses 46 may be of any physical size or shape, and the number, size, and shape of the recesses 46 may vary depending upon the particular processing, application, and device requirements (e.g., stress requirements). For example, in the illustrative embodiment shown in FIG. 12, the recesses 46 may have a generally concave cross-sectional configuration that may extend (e.g., laterally) at least partially under adjacent portions of the active semiconductor layer 18 as indicated in phantom.

Figure 13:
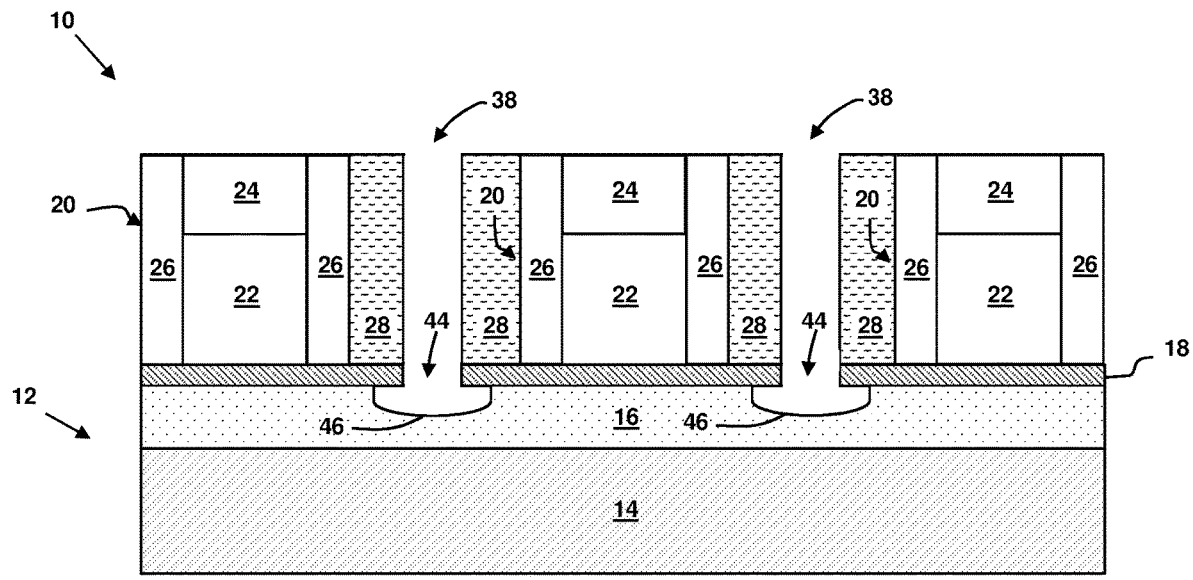
FIG. 13 is a cross-sectional view of a portion of the IC product taken along line D-D in FIG. 12 according to embodiments of the disclosure.

FIG. 13 is a cross-sectional view of a portion of the IC product 10 taken along line D-D in FIG. 12. As shown, the isotropic etching process results in the formation of a plurality of recesses 46 in the buried insulation layer 16 below the openings 44 in the active semiconductor layer 18. Further, as shown, the recesses 46 may have a generally concave cross-sectional configuration that may extend at least partially under adjacent portions of the active semiconductor layer 18.

Figure 14:
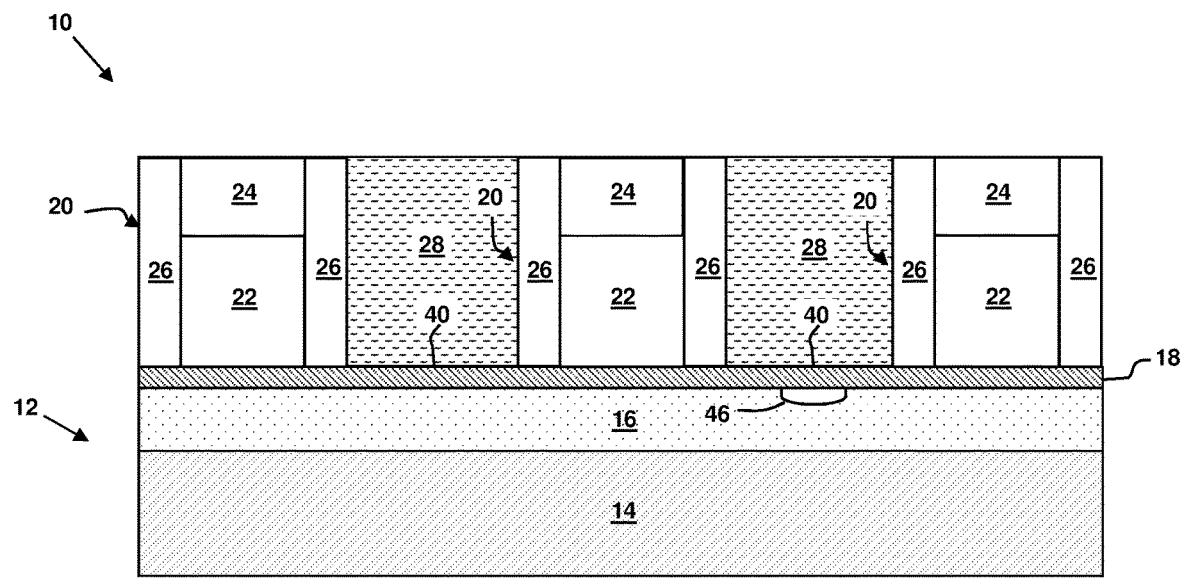
FIG. 14 is a cross-sectional view of a portion of the IC product taken along line E-E in FIG. 12 according to embodiments of the disclosure.

FIG. 14 is a cross-sectional view of a portion of the IC product 10 taken along line E-E in FIG. 12, which depicts the portion of the IC product 10 shown in FIG. 12 after the isotropic etching process. As shown on the left-hand side of FIG. 14, according to embodiments, portions of the BOX layer 16 located away from the openings 44 formed in the active semiconductor layer 16 may not be affected by the isotropic etching process. That is, referring also to left-hand side of the plan view of the IC product 10 depicted in FIG. 12, adjacent recesses 46 formed in the BOX layer 16 may not intersect. However, according to additional embodiments, as shown on the right-hand side of FIGS. 12 and 14, adjacent recesses 46 formed in the BOX layer 16 may partially intersect under the active semiconductor layer 18.

Figure 15:
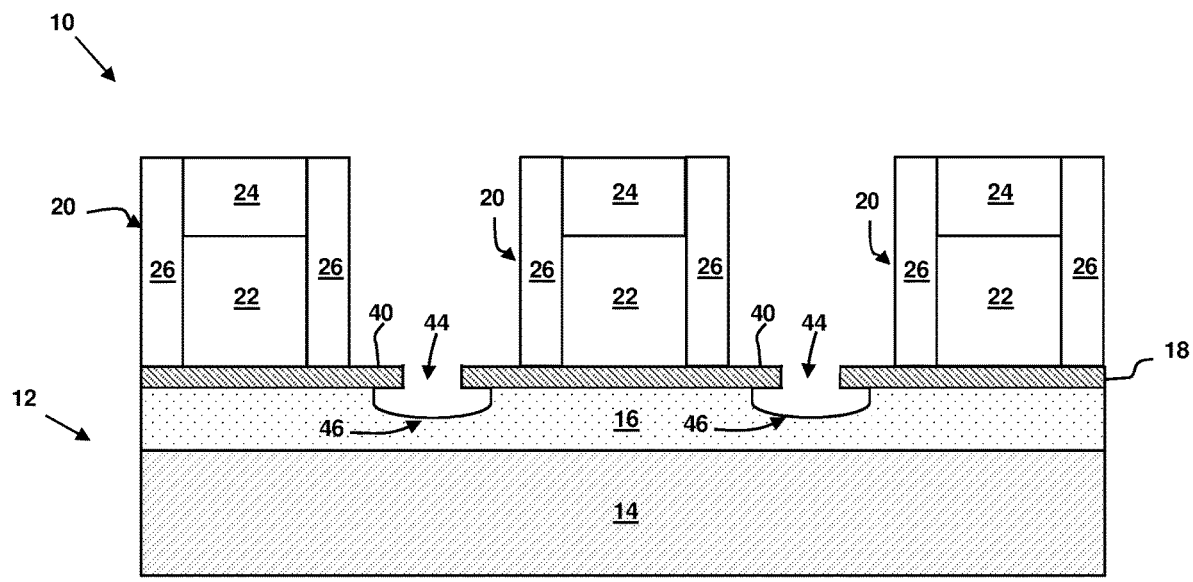
FIGS. 15 and 16 depict the portions of the IC product shown in FIGS. 13 and 14, respectively after an etching process has been performed to remove any remaining sacrificial spacer material according to embodiments of the disclosure.
Figure 16:
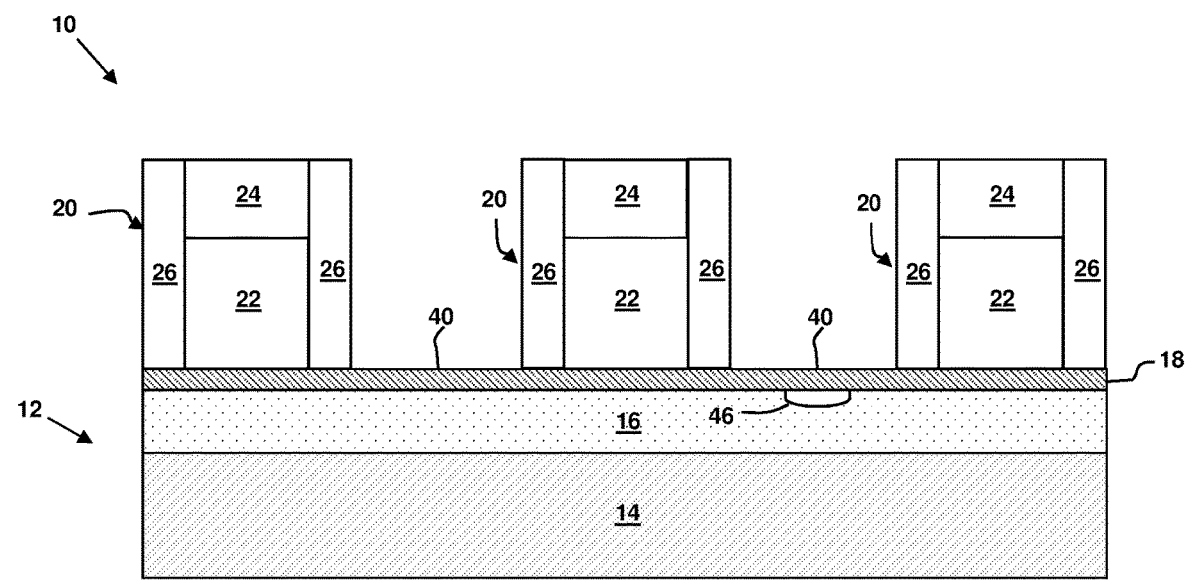

FIGS. 15 and 16 depict the portions of the IC product 10 shown in FIGS. 13 and 14, respectively, after an etching process has been performed to remove any remaining sacrificial spacer material 28. This etching process exposes portions of the active semiconductor layer 18 previously covered by the sacrificial spacer material 28.

Figure 17:
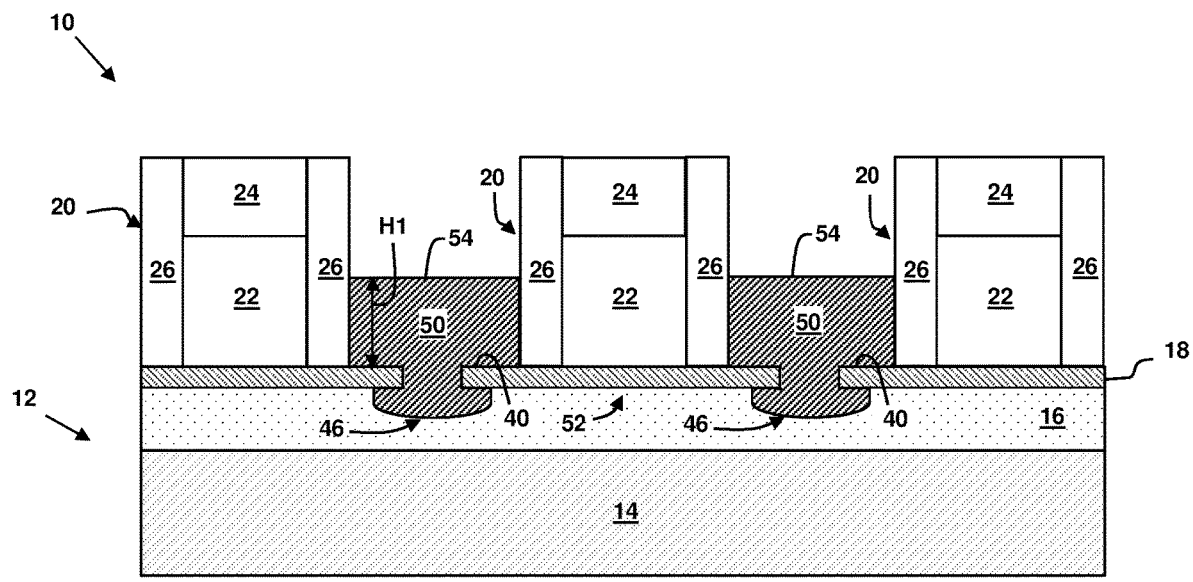
FIGS. 17 and 18 depict the portions of the IC product shown in FIGS. 15 and 16, respectively, after one or more selective source/drain epitaxial deposition processes have been performed to form single crystal epi semiconductor material in the recesses and over the exposed surface of the active semiconductor layer according to embodiments of the disclosure.
Figure 18:
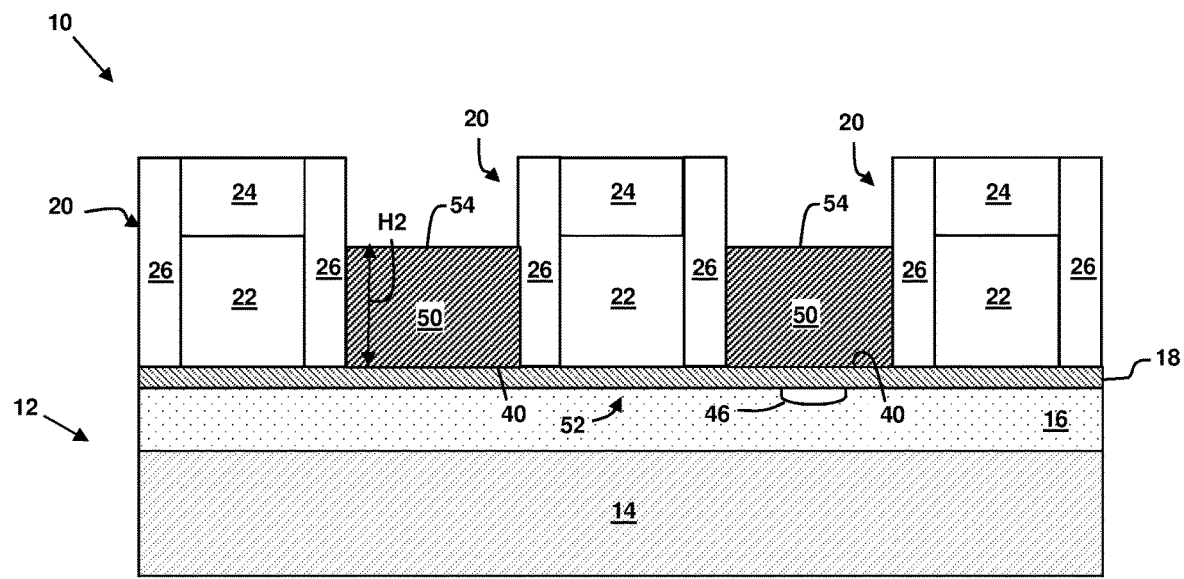

FIGS. 17 and 18 depict the portions of the IC product 10 shown in FIGS. 15 and 16, respectively, after one or more selective source/drain epitaxial deposition (growth) processes have been performed to form single crystal epi semiconductor material 50 in the recesses 46 and over the exposed surfaces of the active semiconductor layer 18. The epi semiconductor material 50 may be formed in such a manner that it imparts a desired stress on the channel region 52 of a transistor device 20, i.e., a compressive stress for a PFET device or a tensile stress for an NFET device. The epi semiconductor material 50 may substantially or completely fill each of the recesses 46 and may contact a lower surface of the active semiconductor layer 18. According to other embodiments, the epi semiconductor material 50 may only partially fill each of the recesses 46

The epi semiconductor material 50 may be any type of semiconductor material, e.g., silicon, SiGe, Ge, SiC, graded SiGe or any other stressor material, etc., and may be formed of the same semiconductor material used to form the active semiconductor layer 18. In one particular process flow, the epi semiconductor material 50 may be substantially un-doped. In other applications, the epi semiconductor material 50 may be doped in situ with an appropriate dopant for the transistor device 20 under construction, i.e., a P-type dopant when the transistors are PFET transistors or an N-type dopant when the transistors are NFET transistors. If desired, at least the portion of un-doped epi semiconductor material 50 above the upper surface 40 of the active semiconductor layer 18 may be doped by performing an ion implantation process.

As previously described, the epi semiconductor material 50 may be formed in such a manner that it imparts a desired stress on the channel region 52 of a transistor device 20, i.e., a compressive stress for a PFET device or a tensile stress for an NFET device. In this particular example, the epi semiconductor material 50 is laterally bounded by the sidewall spacers 26 on the transistor devices 20. The amount of epi semiconductor material 50 that is grown may vary depending upon the particular processing, application, and device requirements. For example, as depicted in FIGS. 17 and 18, the epi semiconductor material 50 may be grown until an upper surface 54 of the epi semiconductor material 50 is at or near the upper surface of the gate structures 22 of the transistor devices 20. It should be noted, however, as can be seen by a comparison of FIGS. 17 and 18, that the growth height H1 of the epi semiconductor material 50 in FIG. 17 relative to the upper surface 40 of the active semiconductor layer 18 over a given time period may be less than the growth height H2 of the epi semiconductor material 50 in FIG. 18 relative to the upper surface 40 of the active semiconductor layer 18 over the same time period (e.g., due to the time it takes for the epi semiconductor material 50 to grow within and fill the recesses 46). To this extent, the average height of the epi semiconductor layer 18 across the IC device 10 is lower than that provided by a similar IC device formed without the recesses 46, which helps to improve the DC and AC performance of the IC device 10.

Figure 19:
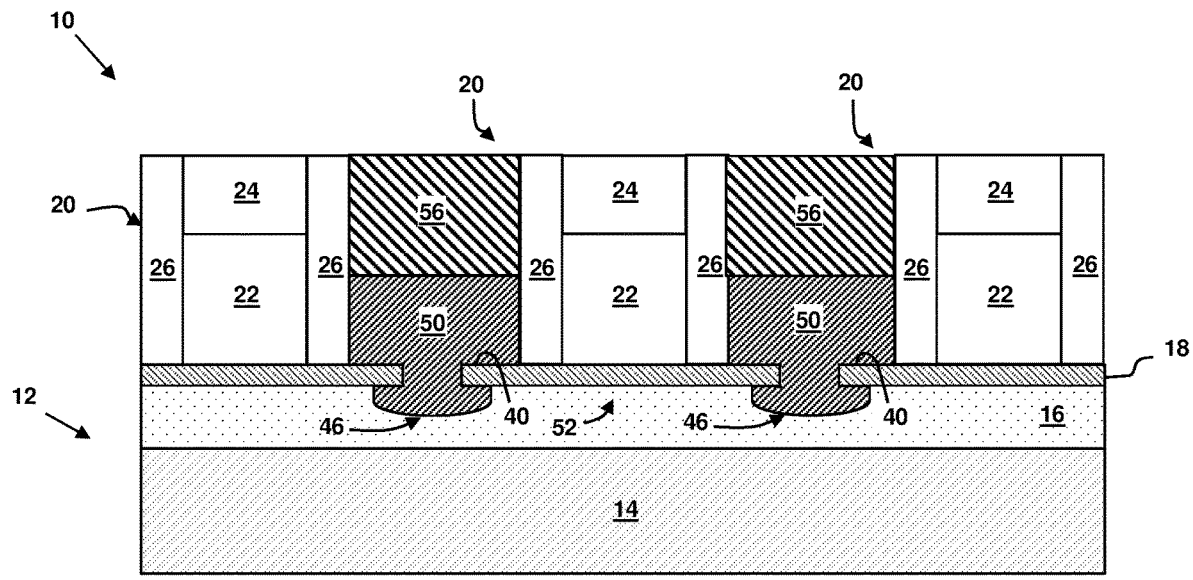
FIGS. 19 and 20 depict the portions of the IC product shown in FIGS. 17 and 18, respectively, after conductive source/drain contact structures have been formed above the epi semiconductor material in each of the source/drain regions of the transistor devices according to embodiments of the disclosure.
Figure 20:
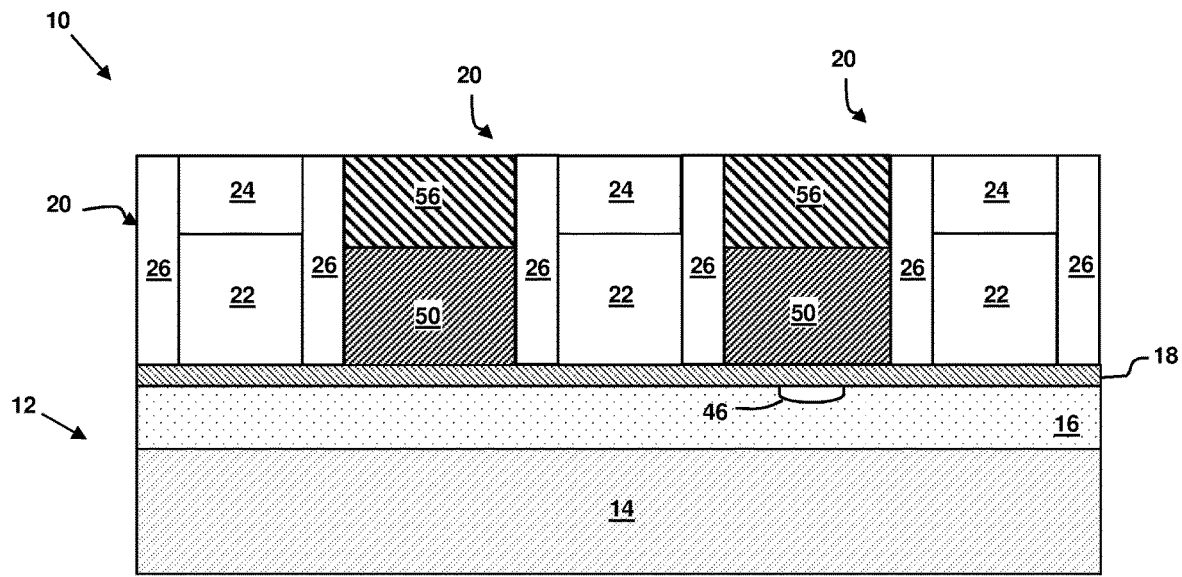

FIGS. 19 and 20 depict the portions of the IC product 10 shown in FIGS. 17 and 18, respectively, after traditional manufacturing operations were performed to form conductive source/drain contact structures 56 above the epi semiconductor material 50 in each of the source/drain regions of the transistor devices 20. The conductive source/drain contact structures 56 may be comprised of a variety of different conductive materials, and they may have a variety of different configurations.

As will be appreciated by those skilled in the art after a complete reading of the present disclosure, as compared to prior art process flows, the formation of the recesses 46 in the BOX layer 16 of the SOI substrate 12 permits the formation of larger volumes of epi semiconductor material 50 adjacent the channel regions 52 of the transistor devices 20. Also note that, using the methods disclosed herein, at least some of the epi semiconductor material 50 is positioned below the active semiconductor layer 18 in the source/drain regions adjacent the channel regions 52 of the transistor devices 20. By forming this relatively larger volume of epi semiconductor material 50 adjacent the channel regions 52, and/or by maintaining a substantial amount of the active semiconductor layer 18 in situ over the source/drain regions of the transistor devices 20 and adjacent the channel regions 52, the amount of relaxation of the stress imparted by the epi semiconductor material 50 on the channel regions 52 due to subsequent manufacturing operations may be reduced or eliminated. That is, the epi semiconductor material 50 formed as described herein may still impart the desired level of stress to the channel regions 52 of the transistor devices 20 and is not significantly adversely affected. In addition, the substantial amount of the active semiconductor layer 18 remaining in situ over the source/drain regions of the transistor devices 20 and adjacent the channel regions 52 substantially increases the area of the active semiconductor layer 18 that is available for the growth of the epi semiconductor material 50 and provides for higher quality growth of the epi semiconductor material 50.

Referring again to FIG. 12, it can be seen that the openings 44 in the active semiconductor layer 18 may be aligned along a line X that extends parallel to a length L of the transistor devices 20 in the IC device 10. In addition, as shown in FIG. 12, the openings 44 may be centered between adjacent transistor devices 20, may be separated by a separation distance S, and may have substantially the same size and configuration. According to embodiments, as shown in FIG. 12, the separation distance S may be the same or substantially the same between immediately adjacent openings 44 in the active semiconductor layer 18. According to other embodiments, the separation distance S between immediately adjacent openings 44 in the active semiconductor layer 18 may vary.

Figure 21:
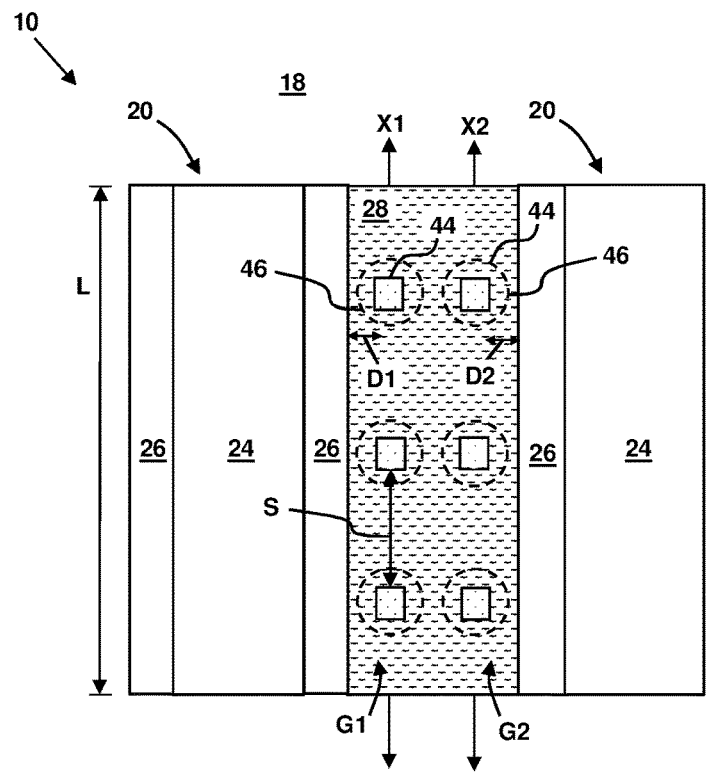
FIG. 21 is a plan view of a portion of the IC product according to additional embodiments after a subsequent isotropic etching process has been performed on the exposed BOX layer via openings formed in the active semiconductor layer according to embodiments.

Similar to FIG. 12, FIG. 21 is a plan view of a portion of the IC product 10 according to additional embodiments after a subsequent isotropic etching process has been performed on the exposed BOX layer 16 via openings 44 formed in the active semiconductor layer 18. In this case, the openings 44 have been formed using a mask (not shown) having a set of corresponding openings different than the openings 32 in the mask 30 depicted in FIG. 4.

In FIG. 21, groups G1 and G2 of the plurality of openings 44 in the active semiconductor layer 18 may be positioned along respective lines X1, X2 extending parallel to the length L of the transistor devices 20 in the IC device 10. Further, groups G1 and G2 may include the same number N1, N2 (N1=N2) of openings 44 in the active semiconductor layer 18. The openings 44 may be positioned at substantially the same distance D1, D2 (D1=D2) or different distances D1, D2 (D1≠D2) from the sidewall spacer 26 of an immediately adjacent transistor device 20, may be separated by a separation distance S, and may have substantially the same size and configuration. The separation distance S may be the same or substantially the same between immediately adjacent openings 44 in the active semiconductor layer 18 as shown in FIG. 21. The resultant recesses 46 formed in the BOX layer 16 are depicted in phantom in FIG. 21.

Again, similar to FIG. 12, FIG. 22 is a plan view of a portion of the IC product 10 according to additional embodiments after a subsequent isotropic etching process has been performed on the exposed BOX layer 16 via openings 44 formed in the active semiconductor layer 18 (again using a mask (not shown) having a set of corresponding openings different than the openings 32 in the mask 30 depicted in FIG. 4).

Figure 22:
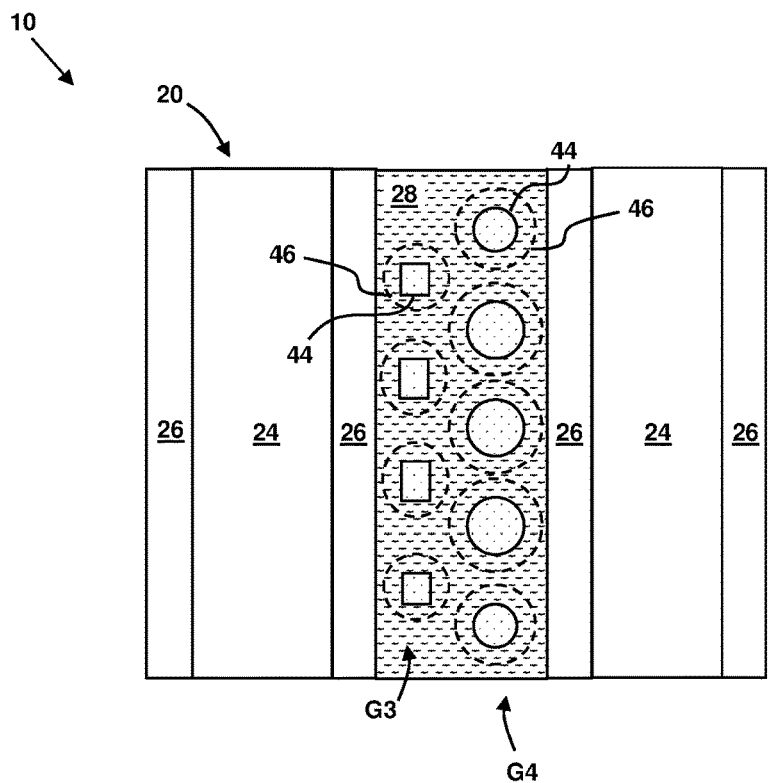
FIG. 22 is a plan view of a portion of the IC product according to additional embodiments after a subsequent isotropic etching process has been performed on the exposed BOX layer via openings formed in the active semiconductor layer according to embodiments.

As depicted in FIG. 22, groups G3 and G4 of the openings 44 in the active semiconductor layer 18 may include different numbers N3, N4 (N3 N4) of openings 44 in the active semiconductor layer 18. In this case, N3=4 and N4=5. Further, the separation, positioning relative to an immediately adjacent transistor device 20, sizes, and configurations of the openings 44 of and within each group G3, G4 may vary. As shown in FIG. 22, for example, the recesses 46 formed via the openings 44 in group G3 are smaller than the recesses 46 formed via the openings 44 in group G4 due to the difference in size of the respective openings 44. The resultant configuration of the various recesses 46 may also vary based on the size and/or configuration of the various openings 44.

In general, according to embodiments, the number, separation, positioning, sizes, and/or configurations of the openings 44 may be varied as required to provide a desired growth of the epi semiconductor material 50 within the recesses 46 and on the active semiconductor layer 18, and to optimize the resultant stress imparted on the channel regions 52 of the transistor devices 20 by the epi semiconductor material 50. Further, an improvement in the quality of the epi semiconductor material 50 is provided by limiting the amount of the active semiconductor layer 18 that is removed when forming the openings 44.

The sizes of the openings 44 is generally limited by process capability and may be as small as 2 nm×2 nm (assuming a square opening 44). Smaller openings 44 may be possible as process capabilities improve. If the openings 44 are too small then it may be challenging to etch the BOX layer 16 below the openings 44 and to grow the epi semiconductor material 50 in the recesses 46 formed therein.

The methods disclosed herein provide a significant stress improvement compared to known methods of imparting stress on the channel region of a transistor device. For example, for a PFET transistor device, the methods disclosed herein may provide for a 10% or higher increase in the compressive stress applied on the channel region of the PFET transistor device compared to known methods. Further, for an NFET transistor device, the methods disclosed herein also provide a significant improvement in the tensile stress applied on the channel region of the NFET transistor device compared to known methods.

The increased volume of epi semiconductor material provided using the methods disclosed herein reduces the source to drain resistance of the transistor devices, which results in an improvement in the performance of the transistor devices. Such improvements may include, for example, an increase in the drain current Id and a decrease in the gate to epi capacitance (which can, e.g., boost AC performance). The amount of relaxation of the stress applied by the epi semiconductor material due to subsequent manufacturing operations may be also be reduced or eliminated.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the disclosure. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A transistor device formed on a semiconductor-on-insulator (SOI) substrate comprising a bulk semiconductor layer, a buried insulation (BOX) layer positioned on the bulk semiconductor layer, and an active semiconductor layer positioned on the BOX layer, the transistor device comprising:
  a gate structure, sidewall spacers on opposing sides of the gate structure, and a source/drain region adjacent each sidewall spacer;
  a plurality of distinct openings extending through the active semiconductor layer of the SOI substrate in each source/drain region, each opening of the plurality of openings extending to a respective recess formed in the BOX layer of the SOI substrate in each source/drain region, wherein each recess extends under a portion of the active semiconductor layer; and
  an epitaxial (epi) semiconductor material disposed in the recesses in the BOX layer, in the plurality of openings through the active semiconductor layer in each source/drain region, and over a surface of the active semiconductor layer.

2. The transistor device according to claim 1, wherein a portion of the BOX layer is positioned between the epi semiconductor material in the recesses and the bulk semiconductor layer of the SOI substrate.

3. The transistor device according to claim 1, wherein the epi semiconductor material is laterally bounded by the sidewall spacer.

4. The transistor device according to claim 1, wherein a growth height of the epi semiconductor material over the plurality of openings in the active semiconductor in each source/drain region is less than a growth height of the epi semiconductor material layer on an upper surface of the active semiconductor layer.

5. The transistor device according to claim 1, wherein immediately adjacent openings of the plurality of openings in the active semiconductor layer in each source/drain region are separated from each other by substantially a same distance.

6. The transistor device according to claim 1, wherein immediately adjacent openings of the plurality of openings in the active semiconductor layer in each source/drain region are separated from each other by a portion of the active semiconductor layer.

7. The transistor device according to claim 1, wherein the plurality of openings in the active semiconductor layer in each source/drain region are positioned at substantially a same distance from the sidewall spacer.

8. The transistor device according to claim 1, wherein the plurality of openings in the active semiconductor layer in each source/drain region have a substantially uniform configuration.

9. The transistor device according to claim 1, wherein the epi semiconductor material imparts a stress on a channel region of the transistor device.

10. An integrated circuit device, comprising:
  a transistor device formed on a semiconductor-on-insulator (SOI) substrate comprising a bulk semiconductor layer, a buried insulation (BOX) layer positioned on the bulk semiconductor layer, and an active semiconductor layer positioned on the BOX layer, the transistor device comprising:
    a gate structure, sidewall spacers on opposing sides of the gate structure, and a source/drain region adjacent each sidewall spacer;
    a plurality of distinct openings extending through the active semiconductor layer of the SOI substrate in each source/drain region, each opening of the plurality of openings separated from each other by a portion of the active semiconductor layer, each opening of the plurality of openings extending to a respective recess formed in the BOX layer of the SOI substrate in each source/drain region, wherein each recess extends under a portion of the active semiconductor layer;
    an epitaxial (epi) semiconductor material disposed in the recesses in the BOX layer, in the plurality of openings through the active semiconductor layer in each source/drain region, and over a surface of the active semiconductor layer; and
    a conductive source/drain contact structure on the epi semiconductor material in each source/drain region of the transistor device.

11. The integrated circuit device according to claim 10, wherein a portion of the BOX layer is positioned between the epi semiconductor material in the recesses and the bulk semiconductor layer of the SOI substrate.

12. The integrated circuit device according to claim 10, wherein the epi semiconductor material is laterally bounded by the sidewall spacer.

13. The integrated circuit device according to claim 10, wherein a growth height of the epi semiconductor material over the plurality of openings in the active semiconductor in each source/drain region is less than a growth height of the epi semiconductor material layer on an upper surface of the active semiconductor layer.

14. The integrated circuit device according to claim 10, wherein immediately adjacent openings of the plurality of openings in the active semiconductor layer in each source/drain region are separated from each other by substantially a same distance.

15. The integrated circuit device according to claim 10, wherein the plurality of openings in the active semiconductor layer in each source/drain region are positioned at substantially a same distance from the sidewall spacer.

16. The integrated circuit device according to claim 10, wherein the plurality of openings in the active semiconductor layer in each source/drain region have a substantially uniform configuration.

17. The integrated circuit device according to claim 10, wherein the epi semiconductor material imparts a stress on a channel region of the transistor device.

18. A method, comprising:
  providing a semiconductor-on-insulator (SOI) substrate comprising a bulk semiconductor layer, a buried insulation (BOX) layer positioned on the bulk semiconductor layer, and an active semiconductor layer positioned on the BOX layer;

forming a transistor device on the SOI substrate, the transistor device including a gate structure, sidewall spacers on opposing sides of the gate structure, and a source/drain region adjacent each sidewall spacer;

forming a plurality of distinct openings through the active semiconductor layer of the SOI substrate in each source/drain region of the transistor device;

forming a recess in the BOX layer of the SOI substrate under each opening of the plurality of openings in each source/drain region, wherein each recess extends under a portion of the active semiconductor layer; and forming an epitaxial (epi) semiconductor material in each recess in the BOX layer, in the plurality of openings through the active semiconductor layer in each source/drain region, and over a surface of the active semiconductor layer.

19. The method according to claim 18, further comprising separating immediately adjacent openings of the plurality of openings in the active semiconductor layer in each source/drain region from each other by substantially a same distance.

20. The method according to claim 18, further comprising positioning the plurality of openings in the active semiconductor layer in each source/drain region at substantially a same distance from the sidewall spacer.

* * * * *